(12) United States Patent
Albertinetti

(10) Patent No.: US 12,354,886 B2
(45) Date of Patent: Jul. 8, 2025

(54) METHOD OF MANUFACTURING SEMICONDUCTOR DEVICES AND CORRESPONDING SEMICONDUCTOR DEVICE

(71) Applicant: STMicroelectronics S.r.l., Agrate Brianza (IT)

(72) Inventor: Andrea Albertinetti, Sizzano (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 508 days.

(21) Appl. No.: 17/752,503

(22) Filed: May 24, 2022

(65) Prior Publication Data
US 2022/0384211 A1 Dec. 1, 2022

(30) Foreign Application Priority Data
May 31, 2021 (IT) .......... 102021000014198

(51) Int. Cl.
*H01L 21/56* (2006.01)
*H01L 23/544* (2006.01)

(52) U.S. Cl.
CPC ........ *H01L 21/56* (2013.01); *H01L 23/544* (2013.01)

(58) Field of Classification Search
CPC ..... H01L 21/56; H01L 23/544; H01L 21/561; H01L 21/568; H01L 23/295; H01L 23/3107; H01L 23/3135; H01L 24/32; H01L 24/73; H01L 24/82; H01L 24/92; H01L 2223/5442; H01L 2223/54426; H01L 2223/54473; H01L 2224/32245;
(Continued)

(56) References Cited

U.S. PATENT DOCUMENTS

2017/0250162 A1* 8/2017 Soga .............. H01L 24/27
2017/0367182 A1* 12/2017 Wu ................. C09D 4/00
2021/0050226 A1* 2/2021 Derai ............. H01L 21/561
(Continued)

FOREIGN PATENT DOCUMENTS

CN 108351727 A * 7/2018 .......... B60K 20/02

OTHER PUBLICATIONS

Charipar et al. "Laser printing of flip-chip interconnect for high frequency applications", Journal of Manufacturing Processes, 32(2018), pp. 110-115. (Year: 2018).*
(Continued)

*Primary Examiner* — Telly D Green
(74) *Attorney, Agent, or Firm* — Crowe & Dunlevy LLC

(57) ABSTRACT

One or more semiconductor dice are arranged on a substrate. The semiconductor die or dice have a first surface adjacent the substrate and a second surface facing away from the substrate. Laser-induced forward transfer (LIFT) processing is applied to the semiconductor die or dice to form fiducial markers on the second surface of the semiconductor die or dice. Laser direct structuring (LDS) material is molded onto the substrate. The fiducial markers on the second surface of the semiconductor die or dice are optically detectable at the surface of the LDS material. Laser beam processing is applied to the molded LDS material at spatial positions located as a function of the optically detected fiducial markers to provide electrically conductive formations for the semiconductor die or dice.

11 Claims, 2 Drawing Sheets

(58) Field of Classification Search
CPC . H01L 2224/82039; H01L 2224/82103; H01L 2224/8213; H01L 2924/12042
See application file for complete search history.

(56) References Cited

U.S. PATENT DOCUMENTS

2021/0050227 A1\* 2/2021 Pok .................... H01L 21/4825
2021/0139317 A1    5/2021 Pahl

OTHER PUBLICATIONS

IT Search Report and Written Opinion for priority application, IT 102021000014198, report dated Feb. 10, 2022, 11 pgs.
Charipar Kristin M et al: "Laser printing of flip-chip interconnects for high frequency applications", Journal of Manufacturing Processes, vol. 32, Apr. 1, 2018, pp. 110-115.

\* cited by examiner

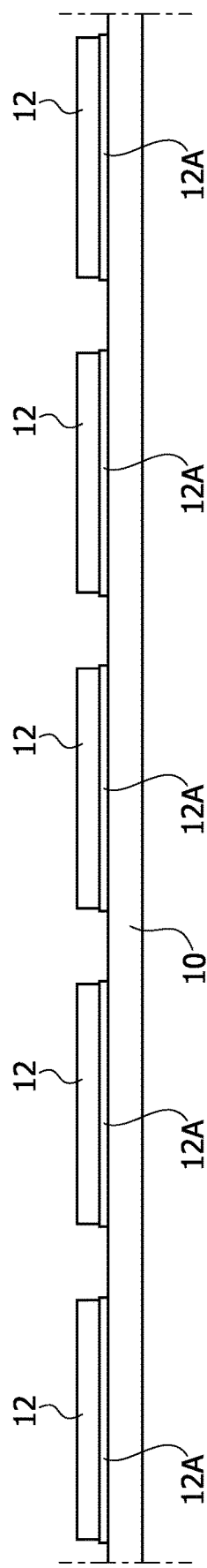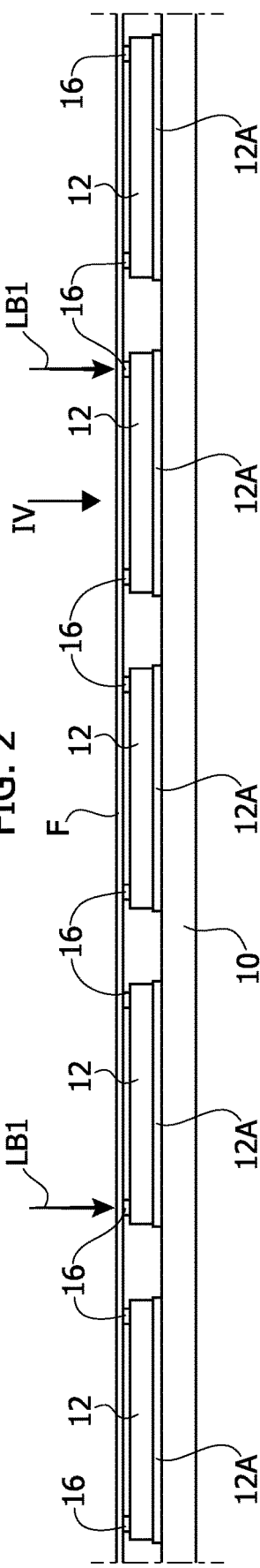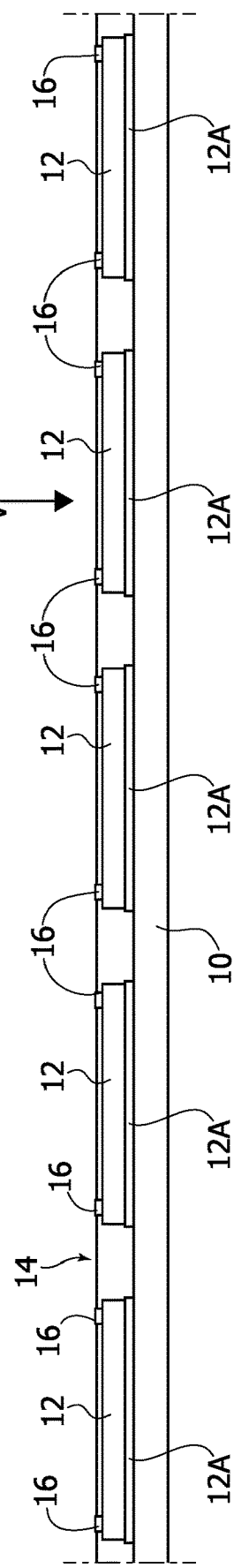

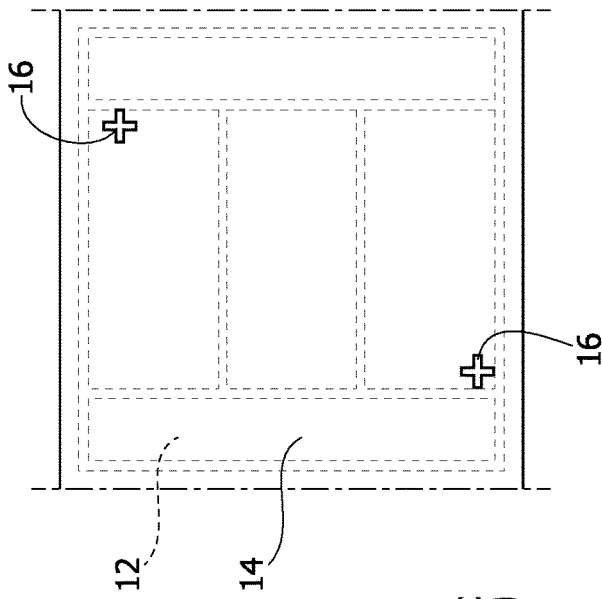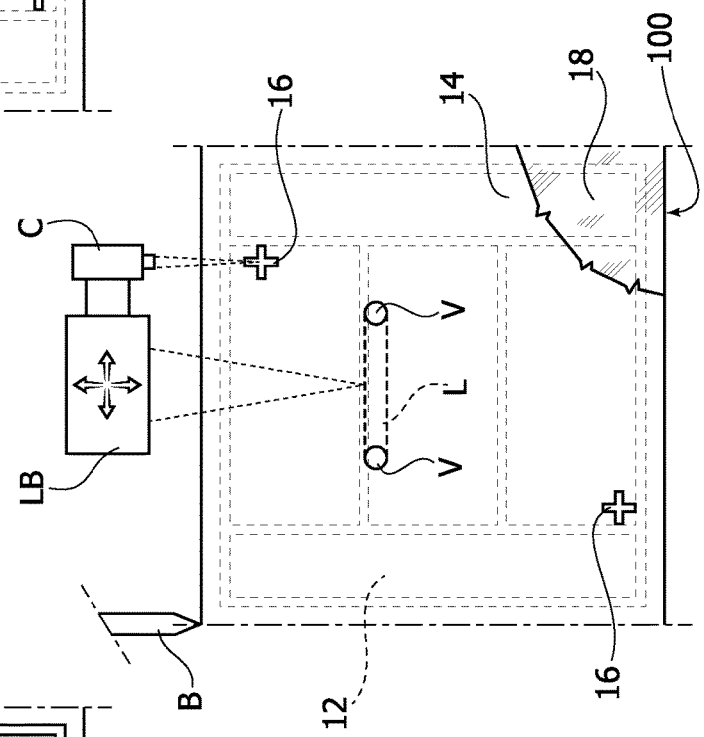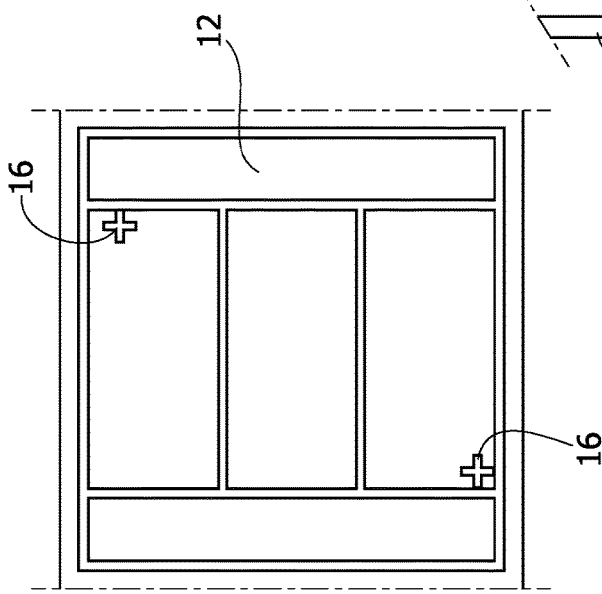

METHOD OF MANUFACTURING SEMICONDUCTOR DEVICES AND CORRESPONDING SEMICONDUCTOR DEVICE

PRIORITY CLAIM

This application claims the priority benefit of Italian Application for Patent No. 102021000014198, filed on May 31, 2021, the content of which is hereby incorporated by reference in its entirety to the maximum extent allowable by law.

TECHNICAL FIELD

The description relates to manufacturing semiconductor devices.

One or more embodiments may be applied to manufacturing semiconductor devices such as integrated circuits (ICs), for instance.

BACKGROUND

A conventional process in fabricating semiconductor devices comprises providing a leadframe onto which one or more semiconductor chips or dice are arranged (attached) via glue dispensing, for instance.

An insulating encapsulation (an epoxy resin, for instance) can be molded, e.g., via compression molding, onto the leadframe having the semiconductor chips or dice arranged thereon.

This may occur after a wire bonding pattern has been formed in order to provide electrical connections between electrically conductive leads in the leadframe and die pads at the top or front surface of the semiconductor chips or dice.

Laser Direct Structuring (LDS), oftentimes referred to also as direct copper interconnection or DCI technology, has been proposed to replace conventional wire bonding.

An encapsulation of LDS material is molded (again, via compression molding, for instance) onto the leadframe having the semiconductor chips or dice arranged thereon and vias/lines structured in the LDS molding compound via laser machining (usually followed by plating) replace a conventional wire bonding in providing electrical connections between electrically conductive leads in the leadframe and die pads at the top or front surface of the semiconductor chips or dice.

In such a process flow a laser beam source can be aligned to reference formations or markers (so-called "fiducials") in the leadframe (holes and ovals on the rails, for instance).

Since the LDS compound (which is substantially light-impermeable) covers the underlying structures, this approach cannot take into account in a precise manner the actual positions (and possible rotation) of the semiconductor chips or dice arranged on the leadframe.

This negatively affects the assembly yield in so far as laser direct structuring ends up by being performed as a "blind" process: the chips or dice on the leadframe are encapsulated in a LDS molding compound (just like in Quad-Flat No-leads packages) and no references at unit level are available to align with each die for accurate direct structuring.

In principle, strip mapping after die attachment may permit to gain information on the actual location and orientation of each chip on the leadframe: automated optical inspection (AOI) equipment may capture the real position of the dice after die attach and communicate it to the laser machine that will adapt structuring the vias and lines accordingly.

This step adds to the time and cost of the assembly flow and is unable to take into account possible shrinkage effects induced on the leadframe by the LDS molding compound: such effects do indeed take place after an AOI equipment may gather information on the actual location and orientation of the chips on the leadframe.

This may result, for instance, in undesirably low yield for devices with small pads due to misalignment of actual die positioning with respect to expected nominal coordinates.

There is accordingly a need in the art to overcome the drawbacks discussed in the foregoing, thus facilitating application of laser direct structuring (LDS) technology to manufacturing semiconductor devices.

SUMMARY

One or more embodiments may relate to a method.

One or more embodiments may relate to a corresponding semiconductor device.

In an embodiment, a method comprises: providing a substrate; arranging at least one semiconductor die on the substrate, the at least one semiconductor die having a first surface adjacent the substrate and a second surface facing away from the substrate; applying laser-induced forward transfer (LIFT) processing to the at least one semiconductor die to form at least one marker on the second surface of the at least one semiconductor die facing away from the substrate; molding laser direct structuring (LDS) material onto the substrate having the at least one semiconductor die arranged thereon with the at least one marker on the second surface of the at least one semiconductor die optically detectable at the surface of the laser direct structuring material; and laser beam processing the laser direct structuring material molded onto the substrate having at least one semiconductor die arranged thereon to provide electrically conductive formations therein. The laser beam processing of the laser direct structuring material comprises applying laser beam energy to the surface of the laser direct structuring material at spatial positions located as a function of the at least one marker optically detectable at the surface of the laser direct structuring material.

In an embodiment, a semiconductor device comprises: an assembly provided by way of the foregoing method to include a substrate, at least one semiconductor die arranged on the substrate as well as laser direct structuring material molded thereon with electrically conductive formations for the at least one semiconductor die arranged on the substrate. Package molding material is molded onto said assembly opposite said substrate to provide encapsulation thereof.

BRIEF DESCRIPTION OF THE DRAWINGS

One or more embodiments will now be described, by way of example only, with reference to the annexed figures, wherein:

FIGS. 1, 2 and 3 are cross-sectional views exemplary of various steps in manufacturing semiconductor products according to embodiments of the present description;

FIG. 4 is a view according to arrow IV in FIG. 2, reproduced on an enlarged scale;

FIG. 5 is a view according to arrow V in FIG. 3, reproduced on an enlarged scale; and FIG. 6 is a view essentially corresponding to FIG. 5, exemplary of possible further steps in manufacturing semiconductor products according to embodiments of the present description.

DETAILED DESCRIPTION

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

In the ensuing description, various specific details are illustrated in order to provide an in-depth understanding of various examples of embodiments according to the description. The embodiments may be obtained without one or more of the specific details, or with other methods, components, materials, etc. In other cases, known structures, materials, or operations are not illustrated or described in detail so that various aspects of the embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment", "in one embodiment", or the like, that may be present in various points of the present description do not necessarily refer exactly to one and the same embodiment. Furthermore, particular configurations, structures, or characteristics may be combined in any adequate way in one or more embodiments. The references used herein are provided merely for convenience and hence do not define the extent of protection or the scope of the embodiments.

By way of introduction, the meaning of various designations appearing in the instant description will be briefly recalled.

The designation "leadframe" (or "lead frame") is currently used (see, for instance the USPC Consolidated Glossary of the United States Patent and Trademark Office) to indicate a metal frame that provides support for an integrated circuit chip or die as well as electrical leads to interconnect the integrated circuit in the die or chip to other electrical components or contacts.

Leadframes are conventionally created using technologies such as a photo-etching technology. With this technology, metal (e.g., copper) material in the form of a foil or tape is etched on the top and bottom sides to create various pads and leads.

Laser direct structuring (LDS), oftentimes referred to also as direct copper interconnection (DCI) technology, is a laser-based machining technique now widely used in various sectors of the industrial and consumer electronics markets, for instance for high-performance antenna integration, where an antenna design can be directly formed onto a molded plastic part.

In an exemplary process, the molded parts can be produced with commercially available resins that include additives suitable for the LDS process; a broad range of resins such as polymer resins like PC, PC/ABS, ABS, LCP are currently available for that purpose.

In LDS, a laser beam can be used to transfer a desired electrically-conductive pattern onto a plastic molding that may then be subjected to metallization (for instance via electroless plating with copper or other metals) to finalize a desired conductive pattern.

Laser-induced forward transfer (LIFT) process is a deposition process employing the transfer of material from a donor tape to acceptor substrates via a laser pulse.

It is noted that the figures herein, primarily FIGS. 1 to 3, refer to plural semiconductor devices that are produced simultaneously and finally separated in a "singulation" step as otherwise conventional in the art.

As illustrated in FIG. 1, an otherwise conventional step in fabricating semiconductor devices comprises providing a leadframe 10 (e.g., an etched strip or foil of metal material) onto which one or more semiconductor chips or dice 12 are arranged (attached), e.g., via glue dispensing at 12A.

In various conventional processes (not illustrated for simplicity) an insulating encapsulation of an epoxy resin, for instance, can be molded, e.g., via compression molding, onto the leadframe having the semiconductor chips or dice arranged thereon. This may occur after a wire bonding pattern has been formed in order to provide electrical connections between electrically conductive leads in the leadframe and die pads at the top or front surface of the semiconductor chips or dice.

Laser direct structuring (LDS) has been proposed to replace conventional wire bonding. For instance (skipping to FIG. 3 for simplicity) an encapsulation 14 of LDS material can be molded onto the leadframe 10 having the semiconductor chips or dice 12 arranged thereon. Vias/lines (tracks) structured in the LDS molding compound via laser machining (usually followed by plating) can replace a conventional wire bonding in providing electrical connections between electrically conductive leads in the leadframe and die pads at the top or front surface of the semiconductor chips or dice.

This type of processing and related types of processing are discussed, for instance, in documents such as United Stated Patent Application Publication Nos. 2018/342453 A1, 2020/203264 A1, 2020/321274 A1, 2021/050226 A1 or 2021/050299 A1, all assigned to the same assignee of the instant application and the disclosures of which are hereby incorporated by reference.

Laser direct structuring (LDS) thus represents a laser-based technology now used (also) in manufacturing semiconductor devices wherein electrically conductive formations such as lines and vias can be formed in an otherwise insulating molding compound via laser beam activation or "structuring", possibly followed by plating.

Applying LDS technology to packaging semiconductor devices facilitates creating interconnections from one or more dice to leadframe leads or substrate terminals through vias and lines.

Enabling a laser unit used for activating (structuring) the LDS material to have precise knowledge of the actual position of a semiconductor die (chip) even if the semiconductor die is somehow "masked" by a mold layer extending over the die facilitates effectively replacing wire bonding technology with LDS technology.

As discussed, such a masking effect may undesirably lead to "blind mode" operation of the laser unit, with the laser beam source referenced only to reference formations (so-called "fiducials") on the leadframe and unable to take into account the actual positions (and possible rotation) of the semiconductor chips or dice covered the LDS compound.

Strip mapping after die attachment may be considered for gaining information on the actual location and orientation of each chip on the leadframe: automated optical inspection (AOI) equipment may capture the real position of the dice after die attach and communicate it to the laser machine that will adapt structuring the vias and lines accordingly.

As noted, that step adds to the time and cost of the assembly flow and is unable to take into account possible shrinkage effects induced on the leadframe by the LDS molding compound: these effects come into play only after an AOI equipment has gathered information on the actual location and orientation of each chip on the leadframe.

Commonly-assigned document United States Patent Application Publication No. 2021/050226 A1 discloses an arrangement wherein semiconductor dice are arranged on a substrate such as a leadframe. Each semiconductor die is provided with electrically-conductive protrusions (such as electroplated pillars or bumps) protruding from the semiconductor die opposite the substrate. Laser direct structuring material is molded onto the substrate to cover the semiconductor dice arranged thereon, with the molding operation leaving a distal end of the electrically-conductive protrusion exposed to be optically detectable at the surface of the laser direct structuring material. Laser beam processing the laser direct structuring material is then performed with laser beam energy applied at positions of the surface of the laser direct structuring material that are located by using the electrically-conductive protrusions optically detectable at the surface of the laser direct structuring material as a spatial reference.

While effective, such an approach involves somehow modifying the semiconductor dice in order to provide them with protruding electrically conductive pillars or bumps, with the related processing step being completely distinct from the (subsequent) step of molding the LDS encapsulation.

One or more embodiments as disclosed herein may be based on the recognition that markers ("fiducials") such as those indicated by 16 in FIG. 2 can be provided via laser-induced forward transfer (LIFT) process as schematically represented in FIG. 2. The designation LIFT applies to a process (known per se to those of skill in the art) that facilitates transfer of material from a donor tape or sheet F to an acceptor substrate (here, the chips or dice 12) facilitated by laser pulses.

One or more laser beam sources suited to used for that purpose are designated LB1 in FIG. 2.

General information on the LIFT process can be found, for instance, in P. Serra, et al.: "Laser-Induced Forward Transfer: Fundamentals and Applications", in Advanced Materials Technologies/Volume 4, Issue 1 (incorporated by reference).

An advantage of LIFT processing lies in that LIFT processing lends itself to co-deposition of the fiducials 16 (at unit level, that is, for each chip or die 12) and the LDS molding compound such as 14. That is, in addition to facilitating the transfer/deposition of fiducials 16 on the chips or dice 12, the tape or foil F of LIFT processing can be effectively used for molding the LDS compound 14 onto the chips or dice 12.

This double ability of the LIFT tape or foil F can be exploited in a particularly advantageous manner in conjunction with LDS material 14 that is flowable (e.g., in liquid state, in the form of a viscous liquid, for instance) and can thus be applied (so-to-say, "printed") onto the chips or dice 12 via the LIFT tape or foil F.

As noted, LDS materials can be produced starting from a broad range of resins such as polymer resins that include additives suitable for the LDS process. These materials can be made available both as granules and as flowable material that can become solid or substantially solid after molding (e.g., via curing).

LDS material having a polymer resin basis of epoxy or acrylic resin with a filling of chromium-based and/or copper-based particles suitable for the LDS process was found to be suited for use in a process as described herein.

A process as discussed herein may thus start in a substantially conventional manner providing a (standard) leadframe 10 attachment of dice 12, e.g., via standard glue dispensing 12A.

Unit level markers or fiducials 16 can then be provided via a LIFT process that, in a manner known per se to those of skill in the art, may comprise camera alignment on die pattern and deposition of fiducials 16 (as represented in FIGS. 2 and 4).

Fiducials 16 can be produced with any material compatible with the LIFT process. Curable silicone-based liquid materials can be an advantageous choice due to their rheological properties, thermomechanical properties and good adhesion the other materials of the product.

A LIFT donor tape F suited for transferring such fiducials 16 to the chips 12 as the acceptor substrates may comprise a polymeric tape with a transparent metallic coating (e.g., titanium) on top.

Advantageously, LIFT processing is capable of "patterning" on a topography by adequately steering (in a manner known per se to those of skill in the art) the laser beam LB1 that facilitates transfer of the fiducials 16 to the chips or dice 12 so that different types of fiducials can be produced if desired. Fiducials 16 in the form of small crosses as illustrated in FIGS. 4 and 5 are thus merely exemplary.

Resolution 25 μm<100 picoL can be achieved.

Reaching a targeted feature height, so that the fiducials 16 are optically visible at the (upper) surface of the LDS molding compound 14 may involve multiple passes.

It is noted that LIFT processing admits handling multi-material co-deposition.

As illustrated, LIFT technology facilitates: i) growing (transferring) fiducials 16 on top of a semiconductor chip or die 12 (see FIGS. 2 and 4), and ii) molding LDS compound 14 on top of the semiconductor chip or die 12 exploiting the same (laminar) substrate F (tape or foil, for instance) used for LIFT processing to mold the flowable (e.g., liquid) LDS molding compound 14.

The foregoing can occur with the fiducials 16 left visible at the surface of the LDS compound. In that way, the last (distal) offshoot of the fiducials 16 will not be covered by the LDS molding compound 14 and remain optically visible at the upper surface of the LDS molding compound 14: see FIG. 5. It will be noted that "optically visible" is intended to mean, and cover, both the fiducials 16 being uncovered by any portion of the LDS molding compound and that the fiducials 16 being covered by a portion of the LDS molding compound but only to a degree (i.e., thickness) that would not preclude detection.

Advantageously, the fiducials 16 on the surface of the semiconductor dice 12 will have a height (with reference to the die surface) of about 50 micron.

As illustrated in FIG. 6, once the LIFT tape or foil F removed and the LDS molding compound sufficiently solidified (in a manner known per se to those of skill in the art, e.g., via heat or UV curing) an LDS processing laser unit LB can be used (in a manner likewise known per se to those of skill in the art) to structure in the LDS molding compound 14 lines (traces) L and/or vias V in order to provide—after possible (e.g., Cu) plating—electrically conductive formations coupling the die or dice 12 to the leadframe/substrate 10.

The distal end or ends of the fiducials 16 (even a single fiducial on a chip or die 12 can be provided, but having plural fiducials 16 was found to be advantageous) can thus be located by a camera C (of any standard type) that is coupled to the (LDS processing) laser apparatus LB configured to structure these electrically conductive formations.

While illustrated in a deliberately simplified manner in FIG. 6, laser structuring of electrically-conductive formations such as vias V and lines (tracks) L in the material 14 may facilitate creating an (even quite complex) routing of electrically-conductive formations.

In one or more embodiments, accuracy of LDS laser beam structuring is facilitated by the laser unit LB being guided by the camera C that "sees" the markers (fiducials) 16 visible at (and or near) the surface of the LDS material 14.

The laser unit LB may thus become aware of the actual position of the semiconductor die or dice 12—even though those are masked by the (essentially light-impermeable) LDS compound 14.

Displacement and operation of the laser unit LB can thus be guided by the (tips of the) fiducials 16 that (in possible cooperation with leadframe fiducials, not visible in the figures) may act as reference positioning markers for the laser unit LB.

As conventional in other areas (camera-guided robots, for instance) the camera C and the laser unit L can be mounted on a common carrier that is controllably movable in a manner known to those of skill in the art.

In one or more embodiments, acts intended to complete fabrication of a semiconductor products as described may include a further mass of package molding compound 18 (partly visible in the right lower corner of FIG. 6) molded onto the upper or front surface of the first package material 14 where lines L and/or vias V have been provided by LDS processing (guided via the fiducials 16).

In one or more embodiments, the (further) mass of package molding compound 18 may include conventional (that is, non-LDS) molding compound such as an epoxy molding compound (EMC).

In one or more embodiments, the (further) mass of package molding compound 18 may cover the fiducials 16 so that these are no longer visible.

Again, it is noted that the figures herein, primarily FIGS. 1 to 3, refer to plural semiconductor devices being produced simultaneously and finally separated to form individual devices 100 in a "singulation" step (via a rotary blade B, for instance: see FIG. 6) as otherwise conventional in the art.

Briefly, a method as illustrated herein comprises providing a substrate such as leadframe 10 and arranging thereon one or more semiconductor dice 12 with a first surface (facing downwards in the figures) adjacent the substrate 10 and a second surface (facing upwards in the figures) facing away from the substrate 10.

As discussed, laser-induced forward transfer (LIFT) processing (foil or tape F and laser source LB1) is applied to the semiconductor die or dice 12 to form one or more markers (so-called "fiducials" 16) on the second surface of the semiconductor die/dice 12 facing away from the substrate 10.

Laser direct structuring, LDS material 14 is molded onto the substrate 10 having the semiconductor die or dice 12 arranged thereon so that the marker(s) 16 on the second surface of the semiconductor chips or dice 12 are optically detectable (visible by a camera, for instance) at the surface of the laser direct structuring material.

As discussed, the donor substrate (tape or foil) F used for LIFT processing in order to form the fiducials 16 on acceptor surfaces (chips or dice) can also be used to mold onto the chips or dice 12 (and the substrate 10) the LDS molding compound 14 (applied in a flowable, liquid state).

That is, applying LIFT processing comprises arranging a LIFT donor substrate (tape or foil F) facing the (second, here top) surface of the semiconductor die or dice 12 and selectively applying laser beam energy LB1 to the LIFT donor substrate F.

This facilitates laser-induced forward transfer of the fiducials 16 onto the surface of the semiconductor dice 12 as an acceptor surface.

The laser direct structuring (LDS) material 14 can be molded onto the substrate 10 having the semiconductor dice 12 arranged thereon supplying LDS material 14 between the (second) surface of the semiconductor die 12 and the LIFT donor substrate F arranged facing that surface of the semiconductor dice 12.

Advantageously, this may comprise supplying LDS material 14 in a flowable state between the surface of the at least one semiconductor die 12 and the LIFT donor substrate F arranged facing that surface of the semiconductor die 12.

Laser beam processing (as exemplified by LB in FIG. 6) can thus be applied to the laser direct structuring material 14 molded (and solidified) onto the substrate 10 to provide electrically conductive formations such as lines L and/or vias V.

These formations can provide electrically conductive formations for the semiconductor die or dice 12 arranged on the substrate 10.

As illustrated, LDS laser beam processing comprises applying laser beam energy to the surface of the laser direct structuring material 14 at spatial positions (such as L and/or V) located—that is having their positions identified or determined—as a function of the marker or markers 16 optically detectable at the surface of the laser direct structuring material 14.

It is noted that the sequence of steps illustrated in connection with FIGS. 1 to 6 is merely exemplary and non-limiting.

It will be appreciated that, while possibly included in a same workstation, the LIFT processing laser LB1 and the LDS processing laser LB will be generally different laser sources.

Those of skill in the art will otherwise appreciate that additional steps may be included that are of no specific relevance for the embodiments. Also, some of the steps can be performed in a different manner or in a different order and/or simultaneously.

A semiconductor device such as 100 in FIG. 6 thus comprises an assembly of a substrate or leadframe 10, one or more semiconductor dice 12 arranged (e.g., glued at 12A) on the substrate 10.

The device 100 also comprises laser direct structuring, LDS material 14 molded thereon as well as electrically conductive formations (lines L/vias V) for the semiconductor die or dice 12 arranged on the substrate 10 provided as discussed in the foregoing.

Package molding material 18 (e.g., non-LDS material) can be molded onto the assembly thus formed opposite the substrate to provide encapsulation thereof.

Without prejudice to the underlying principles, the details and the embodiments may vary, even significantly, with respect to what has been described by way of example only without departing from the scope of the embodiments.

The claims are an integral part of the disclosure of embodiments as provided herein.

The extent of protection is determined by the annexed claims.

The invention claimed is:

1. A method, comprising:
arranging at least one semiconductor die on a substrate, wherein the at least one semiconductor die has a first surface adjacent the substrate and a second surface facing away from the substrate;
applying laser-induced forward transfer (LIFT) processing to the at least one semiconductor die to form at least one marker at the second surface of the at least one semiconductor die facing away from the substrate;
wherein applying LIFT processing to the at least one semiconductor die comprises:
arranging a LIFT donor substrate facing the second surface of the at least one semiconductor die; and
selectively applying laser beam energy to the LIFT donor substrate to facilitate laser-induced forward transfer of said at least one marker onto the second surface of the at least one semiconductor die;
molding laser direct structuring (LDS) material onto the substrate having the at least one semiconductor die arranged thereon with the at least one marker at the second surface of the at least one semiconductor die being optically detectable;
wherein molding LDS material onto the substrate comprises:
supplying a flowable LDS material between the second surface of the at least one semiconductor die and the LIFT donor substrate arranged facing the second surface of the at least one semiconductor die using the LIFT donor substrate as a mold for the flowable LDS material;
solidifying the flowable LDS material; and
then removing the LIFT donor substrate; and
laser beam processing the laser direct structuring material molded onto the substrate having at least one semiconductor die arranged thereon to provide electrically conductive formations therein;
wherein said laser beam processing of the laser direct structuring material comprises applying laser beam energy to the surface of the laser direct structuring material at spatial positions located as a function of the at least one marker that is optically detectable.

2. The method of claim 1, wherein the at least one marker at the second surface of the at least one semiconductor die comprises a silicone-based material.

3. The method of claim 1, wherein the laser direct structuring (LDS) material comprises a polymer resin with a filling selected from a group consisting of chromium-based and copper-based particles.

4. The method of claim 1, wherein the at least one marker at the second surface of the at least one semiconductor die has a height of about 50 microns.

5. The method of claim 1, further comprising laser beam processing the laser direct structuring material molded onto the substrate having at least one semiconductor die arranged thereon to provide electrically conductive formations therein for the at least one semiconductor die arranged on the substrate.

6. The method of claim 1, further comprising applying laser-induced forward transfer (LIFT) processing to the at least one semiconductor die to form a plurality of markers at the second surface of the at least one semiconductor die facing away from the substrate.

7. A method, comprising:
arranging at least one semiconductor die on a support substrate, wherein the at least one semiconductor die has a first surface adjacent the support substrate and a second surface facing away from the support substrate;
arranging a donor substrate facing the second surface of the at least one semiconductor die;
transferring at least one marker to the second surface of the at least one semiconductor die using said donor substrate;
with the donor substrate remaining in place, inserting laser direct structuring (LDS) material between the support substrate and the donor substrate;
curing the LDS material to encapsulate the at least one semiconductor die;
removing the donor substrate;
optically detecting the at least one marker; and
using the optically detected at least one marker as a fiducial to perform laser beam processing of the laser direct structuring material to produce electrically conductive formations.

8. The method of claim 7, wherein the donor substrate is a laser-induced forward transfer (LIFT) substrate.

9. The method of claim 8, wherein transferring comprises selectively applying laser beam energy to the LIFT substrate to facilitate laser-induced forward transfer of said at least one marker onto the second surface of the at least one semiconductor die.

10. The method of claim 7, wherein the at least one marker on the second surface of the at least one semiconductor die comprises a silicone-based material.

11. The method of claim 7, wherein the LDS material comprises a polymer resin with a filling selected from a group consisting of chromium-based and copper-based particles.

* * * * *